United States Patent [19]
Böhme

[11] Patent Number: 5,451,908
[45] Date of Patent: Sep. 19, 1995

[54] CIRCUIT ARRANGEMENT WITH CONTROLLED PINCH RESISTORS

[75] Inventor: Rolf Böhme, Bad Friedrichshall, Germany

[73] Assignee: Temic Telefunken microelectronic GmbH, Heilbronn, Germany

[21] Appl. No.: 264,322

[22] Filed: Jun. 23, 1994

[30] Foreign Application Priority Data

Sep. 2, 1993 [DE] Germany .............. 43 29 639.4

[51] Int. Cl.6 ............................................. H03F 3/16
[52] U.S. Cl. ................................... 330/300; 330/288
[58] Field of Search .............. 330/252, 254, 257, 261, 330/288, 300, 296

[56] References Cited

U.S. PATENT DOCUMENTS

| | | | |
|---|---|---|---|
| 4,596,958 | 6/1986 | Graeme et al. | 330/253 |
| 4,901,031 | 2/1990 | Kalthoff et al. | 330/253 |
| 4,928,073 | 5/1990 | Arai et al. | 330/292 |
| 5,168,243 | 12/1992 | Feliz et al. | 330/257 X |

FOREIGN PATENT DOCUMENTS

| | | |
|---|---|---|
| 0002751A1 | 7/1979 | European Pat. Off. . |
| 159654 | 10/1985 | European Pat. Off. . |
| 443239 | 8/1991 | European Pat. Off. . |
| 2720653 | 12/1977 | Germany . |
| 3213838 | 10/1983 | Germany . |
| 3811949 | 10/1989 | Germany . |
| 3811950 | 10/1989 | Germany . |

OTHER PUBLICATIONS

S. Akihiro, "Semiconductor Integrated Circuit", Patent Abstracts of Japan, JP4004610, vol. 16, No. 150, (1992).
S. Akihiro, "Differential Amplifier", Patent Abstracts of Japan, JP4150207, vol. 16, No. 429, (1992).
K. Kenji, "Constant Voltage Circuit", Patent Abstracts of Japan, JP5216549, vol. 17, No. 658, (1993).
K. Kenji, "Differential Amplifier Circuit", Patent Abstracts of Japan, JP5218763, vol. 17, No. 661, (1993).

*Primary Examiner*—Steven Mottola
*Attorney, Agent, or Firm*—Spencer, Frank & Schneider

[57] ABSTRACT

According to the invention, a circuit arrangement includes at least two bipolar transistors, each having a base electrode, an emitter electrode and a collector electrode. The two transistors are connected together at their base electrodes and the base electrodes are connected to an auxiliary voltage. The collector electrodes are arranged to be first and second outputs of the circuit arrangement. An emitter resistor is connected to the emitter electrode of each transistor. Each emitter resistor is a pinch resistor having a gate electrode for controlling a resistance value of the respective emitter resistor. The gate electrodes of the respective pinch resistors are configured to be first and second inputs of the circuit arrangement.

9 Claims, 4 Drawing Sheets

CIRCUIT ARRANGEMENT WITH CONTROLLED PINCH RESISTORS

BACKGROUND OF THE INVENTION

1. Field of the Invention

The present invention relates to a circuit arrangement with at least two bipolar transistors connected together at their base electrodes, each having an emitter resistor and connected to a reference potential for supply voltages.

2. Description of the Related Art

In an integrated circuit, pinch resistors are created when a region of relatively high resistance is made very thin or narrow by a depletion layer. The reverse voltage then influences the value of the resistance over the breadth of the depletion zone. In bipolar standard technology, two types of pinch resistor are employed. So-called n-conductive pinch resistors are made from an epitaxial layer by a process whereby a narrow zone is isolated by insular diffusion and is not only covered at the ends, which are needed for the contact windows, but also from the surface by means of a p-implantation. This results in a channel of n-conductive high-resistance material in a surrounding p-conductive environment that belongs to the substrate. Such pinch resistors are used as current-stabilizing series resistors because their resistance increases as the voltage rises. P-conductive pinch resistors, however, are made by the p-implantation or p-diffusion method which is also used for the base of npn transistors. By covering with the $n^+$-implantation for the emitter, a buried high-resistance p-layer results which can be made into a resistor by providing contacts at the ends left open. The surrounding n-conductive material is that of the epitaxial layer which in turn can be isolated by insular diffusion and provided with a contact. This contact serves as gate electrode for the pinch resistor. Such p-conductive pinch resistors from the base implantation thus have the advantage of having an electrically free gate electrode.

The structure of this pinch resistor is equivalent to that of a JFET (junction or junction-gate FET). However, because the breakdown voltage of the emitter-base junction is lower than the pinch-off voltage, these elements cannot be used as conventional JFETs. A very grave disadvantage for a more advanced application of pinch resistors is the wide spread of the resistance value which, under the technological conditions commonly encountered, can cover a range of 1:3, rather like the current gain of the transistors found on a chip.

In bipolar circuits for very low supply voltages, there is the problem that the input voltage ranges that can be processed become very small. If one considers, for example, a simple npn transistor in common-emitter configuration, then the input voltage supplied to the base must have at least the value of the base-emitter voltage together with an allowance for the generally unavoidable emitter resistance. The upper limit is established by the supply voltage and the voltage required for an output configuration of the transistor. With a minimum supply voltage of 1.2 V, for example, only a few 100 mV remain for the permissible input voltage range. This restriction is in contrast to the attainable output voltage ranges which, with a complementary output stage, can approach the value of the supply voltage to within a few 100 mV. In a circuit with 1.5 V supply voltage, one can therefore easily achieve an output range of 1.2 V, but an input of scarcely 0.5 V. In isolation amplifiers, integrators, impedance transformers, etc., this often causes considerable difficulties in dimensioning.

Another disadvantage, especially in circuits with memory function or deep lower cut-off frequency, is presented by the input currents that are required in a bipolar technology configuration for the bases of the input transistors. This reduces, for example, the storage times that can be achieved in a sample-and-hold circuit or in an integrator and this is further worsened by the small voltage ranges mentioned above.

SUMMARY OF THE INVENTION

The object of the invention is to increase the input voltage range and reduce the input currents in bipolar technology circuit arrangements with at least two bipolar transistor connected together at their base electrodes, each having an emitter resistor, and connected to a reference potential for supply voltages.

In accordance with the present invention, this is solved by using pinch resistors with gate electrodes in that pinch resistors are used as emitter resistors of the bipolar transistors. An auxiliary voltage is supplied to the base electrodes while the collector electrodes of the bipolar transistors serve as outputs in the circuit and the gate electrodes of the pinch resistors as inputs. It has been found that pairs of pinch resistors of the same design on a chip differ by less than 0.5% from one another, in a temperature range of 120° C., irrespective of the wide spread in absolute value already mentioned. On this precondition, it is possible to design differential stages that utilize the controllability of pinch resistors. Since the pinch resistors in accordance with the present invention are situated at the point of lowest potential, the gate electrodes can assume any desired higher potential up to the proximity of the breakdown voltage of the depletion layer which is generally slightly higher than 5 V. The utilizable resistance change depends on the thickness and doping of the resistance path and easily reaches a ratio of 1:2 or more. The ratio of currents in the two transistors is only slightly lower than the ratio of the resistances so that an adequate control effect is obtained. With small supply voltages of 1.2 to 5 V and corresponding voltage ranges, useful dimensioning possibilities are available. Since the gate electrode acts like a diode connected in the reverse direction, the input currents are considerably lower than in the case of a circuit with base input.

BRIEF DESCRIPTION OF THE DRAWINGS

The manner in which the invention functions and its various embodiments will now be explained with the help of the figures which show.

DESCRIPTION OF THE PREFERRED EMBODIMENTS

Figure 1:
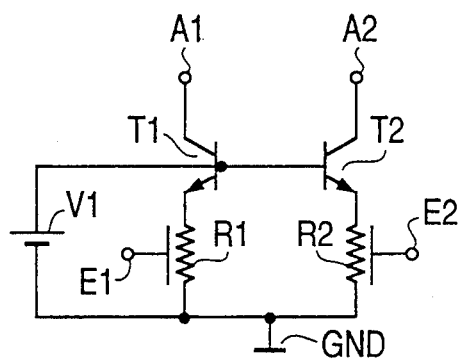
FIG. 1 shows a schematic circuit diagram of a differential stage with controlled pinch resistors in accordance with the present invention.

The schematic circuit diagram FIG. 1 shows two bipolar npn transistors T1 and T2 whose base electrodes are supplied from an auxiliary voltage source V1 and whose emitter-collectors are connected to the reference point GND via controllable pinch resistors R1 and R2, and where the reference point must not necessarily be identical with the frame earth terminal. The gate electrodes E1 and E2 of the pinch resistors are the inputs, the collector electrodes A1 and A2 of the transistors T1 and T2 are the outputs of the circuit.

Figure 7:
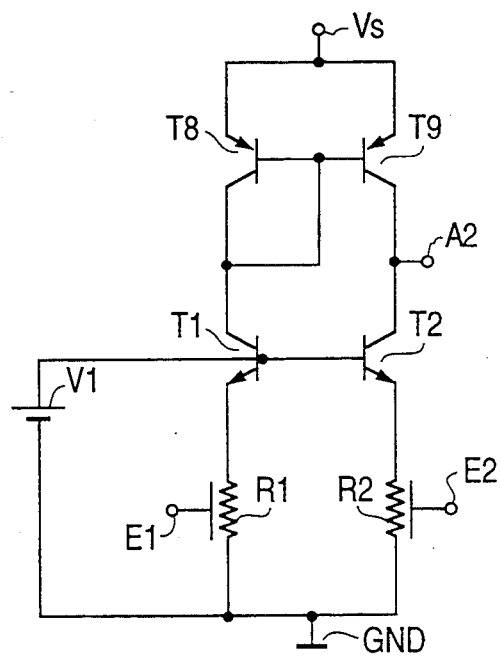
FIG. 7 shows a differential stage in accordance with the present invention with a current balancing circuit on the output side.

Suitable supply voltages are Fed to the outputs A1 and A2 for the intended function. This can be accomplished, for example, by means of a current balancing circuit as shown in FIG. 7 that provides a bias-current-free unsymmetrical output A. In other respects, the design of the output circuit depends on the particular application and is not an object of the present invention. The value of the associated pinch resistor R1 and R2 is set by means of a voltage applied to the gate electrodes E1 and E2, thus influencing the current through the transistor T1 or T2. The control effect is affected by the internal resistance of the transistor because a specific change in resistance results in a basically smaller change in current. This loss is, however less than 10% even for a voltage drop of 0.25 V across the pinch resistor R1 or R2 (and room temperature). The circuit has, therefore, a small voltage requirement. The junction of the pinch resistor must not be polarized in the conducting direction and for this reason the voltages applied to the gate electrodes E1 and E2 should not be lower than the voltage at the emitter of the associated transistor, although it can usually be a few tenths of a volt lower. With a high voltage at the gate electrode E1 or E2, however, the end of the pinch resistor R1 or R2 that is at the reference point is loaded most of all, the maximum permissible voltage at the gate electrode being equal to the permissible reverse voltage and not dependent on the voltage drop across the pinch resistor R1 or R2. A voltage drop of more than about 0.3 V across the pinch resistor thus provides no significant gain in terms of transconductance, although it would reduce the available input voltage range at the gate electrode E1 or E2 respectively.

Figure 2:
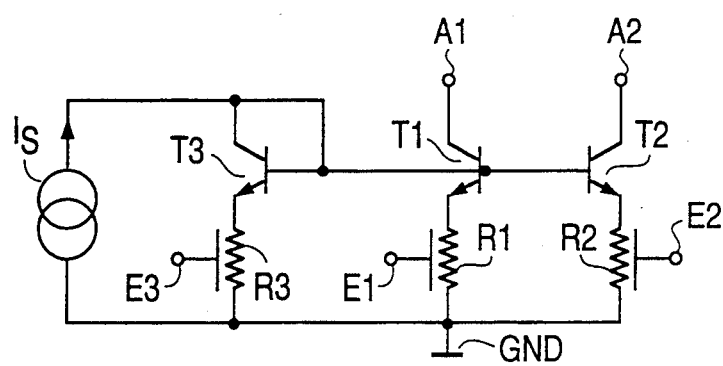
FIG. 2 shows a differential stage in accordance with FIG. 1 with separate generation of the auxiliary voltage.

FIG. 2 shows a possible means of generating the auxiliary voltage V1 for the bases of the transistors T1 and T2. For this purpose, a third pinch resistor R3 and a third npn transistor T3 acting as a diode are connected in series and are provided with current from a current source Is. The gate electrode E3 of the third pinch resistor R3 is connected to a suitable potential, the choice of which influences the characteristics of the circuit.

The particular advantage of generating the auxiliary voltage in this way is that the wide spread in the absolute value of the pinch resistors does not lead to spreads in the operating current through the transistor T1 or T2, respectively. As regards the current source Is, the circuit resembles a current balance with two outputs; a proportionate change in the pinch resistances R1 to R3 changes the output currents at the outputs A1 and A2 only slightly or not at all under the conditions described. The third gate electrode E3 can be used to influence the temperature or control characteristics. For example, if one connects the gate electrodes E1 and E3, the current balance formed from the transistors T3 and T1 is symmetrical and the current at output A1 does not depend on the value of the input voltage at the gate electrodes E1 and E3. The output current at output A2 will differ from the current at the output A1 only if the voltage at the gate electrode E2 is different from the voltage at the gate electrodes E1 and E3. The circuit thus offers common-mode rejection capability.

Figure 10:
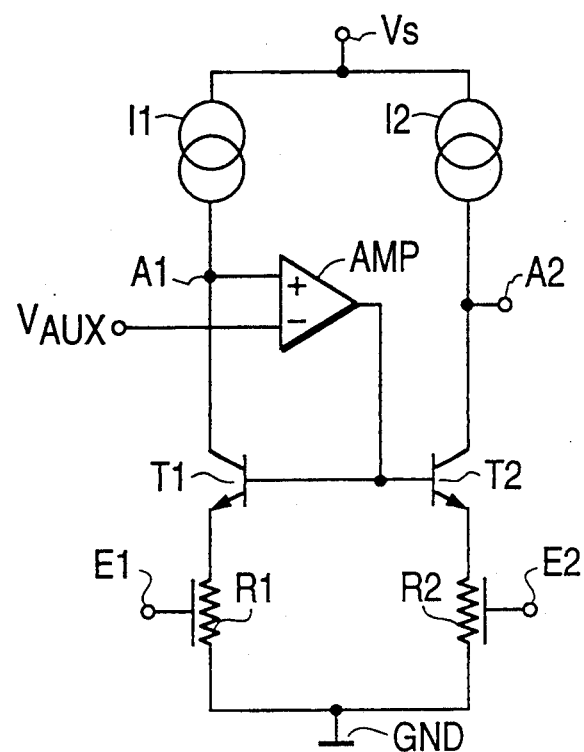
FIG. 10 shows a differential stage in accordance with both FIG. 1 having an inverting input connected to an auxiliary voltage.

One of the two outputs, for example A1, can be used to generate the auxiliary voltage V1 without a third branch. This is embodied in FIG. 3 using an amplifier AMP and a current source I1. The non-inverting amplifier AMP is supplied with the voltage provided at output A1 and feeds it to the base electrodes of the transistors T1 and T2. The amplifier AMP can be a buffer (FIG. 3) with a gain of 1, or it can be a differential amplifier (FIG. 10) with a higher gain if the inverting input is connected to an auxiliary voltage $V_{AUX}$ (FIG. 10). If the input current of the amplifier AMP at A1 is very small compared with the current I1, the current source I1 establishes the current through the transistor T1 and the pinch resistor R1. The voltage at the base electrodes of the transistors T1 and T2 is set accordingly. The current through the transistor T2 differs from the current through the transistor T1 only if the control voltages at E1 and E2 are different. If a current source I2 of the same magnitude as I1 is used and connected to the collector electrode of the transistor T2, a d.c.-free output A2 is created. The current through a load connected to the output A2 and not shown in the figure is therefore proportional to the differential voltage $V_{E1}-V_{E2}$, where $V_{E1}$ and $V_{E2}$ designate the voltages at the gate electrodes E1 and E2 respectively. Owing to the non-linearity of the rheostatic control, the proportionality constant depends on the common-mode component $(V_{E1}+V_{E2})/2$.

Figure 4:
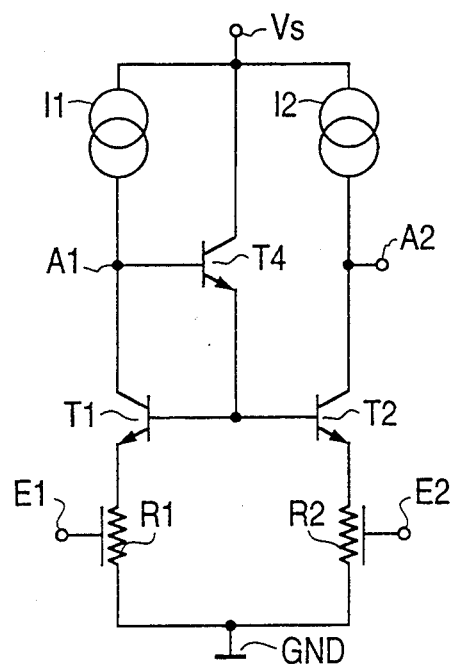
FIG. 4 shows the generation of the auxiliary voltage by means of an emitter follower.
Figure 5:
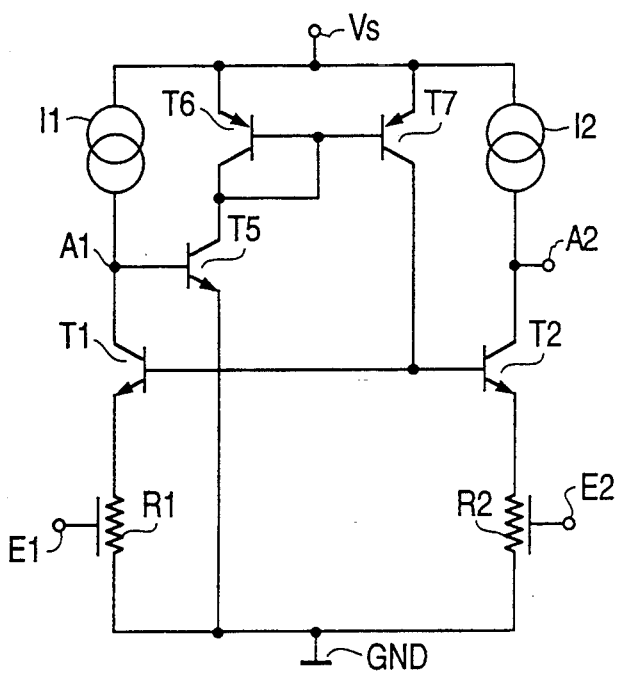
FIG. 5 shows a special embodiment as isolation amplifier of the differential stage in accordance with FIG. 1.
Figure 6:
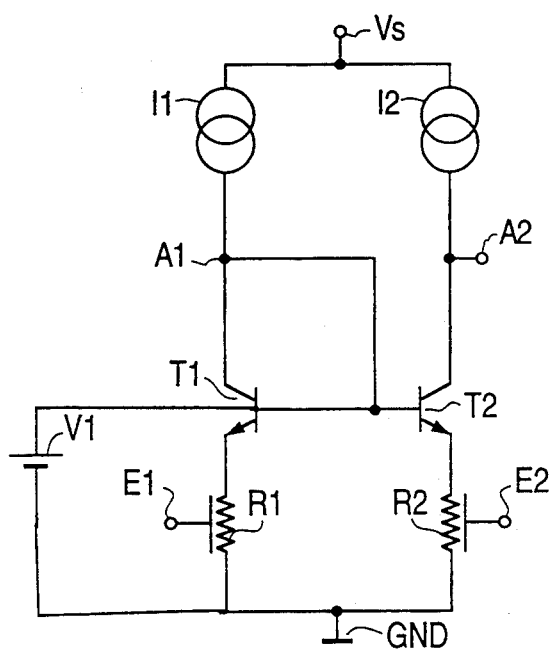
FIG. 6 shows a differential stage in accordance with the present invention in a minimum configuration.

The circuit shown in FIG. 4 and also the other circuits in FIGS. 5 to 7 are voltage-controlled current sources in character. If a capacitor is connected to output A2, an integrator results. There is, no difficulty in making a transfer resistance of several megohm, that is resistance values which are not even approximately available in bipolar integration. Lower cut-off frequencies and higher integration constants or storage times can thus be obtained with such circuits than was possible with the means previously available.

The circuits in FIGS. 4 and 5 show simpler embodiment examples of the amplifier AMP. In FIG. 4, the amplifier comprises an emitter-follower T4. This does, however, result in the voltage required in this circuit increasing by the amount of the base-emitter voltage of the transistor T4 so that this circuit requires Vs to be approximately 2 V at least. The circuit according to FIG. 5 avoids this disadvantage and establishes the voltage at the output A1 at the same level as the base voltage of a transistor T5 whose emitter electrode is connected to the reference point GND in the circuit. The collector electrode, however, is connected to the operating potential Vs of the circuit via a current balancing circuit made up of two transistors T6 and T7. The base conductor For the transistors T1 and T2 is controlled and supplied from this current balance.

Figure 3:
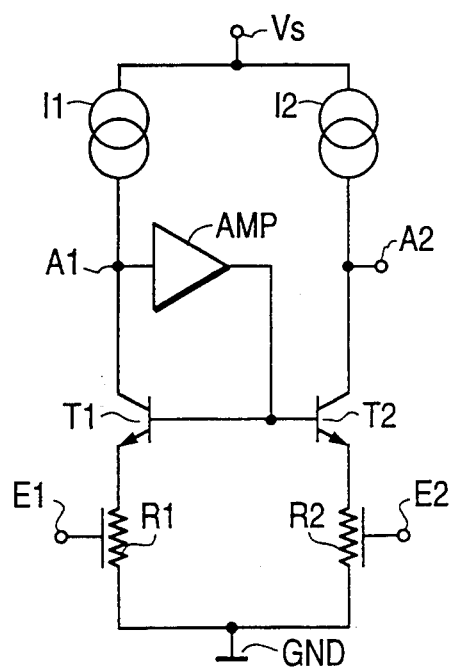
FIG. 3 shows a differential stage in accordance with FIG. 1 with internal generation of the auxiliary voltage by means of an isolation amplifier.

With only a slightly less advantageous behaviour, the amplifier in FIG. 3 can be omitted entirely according to FIG. 6 and replaced by a connection from the output A1 to the base connection of the transistors T1 and T2. This results in a larger offset of the input voltage $V_{E1}-V_{E2}$ than in the preceding circuits because two base currents must be drawn from the current of source I1. The unbalance can be compensated by a pinch resistor R1 that is slightly larger than the pinch resistor R2 or by a current I1 that is greater than the current I2. This circuit can be used if no exacting demands are placed on the offset voltage.

Figure 8:
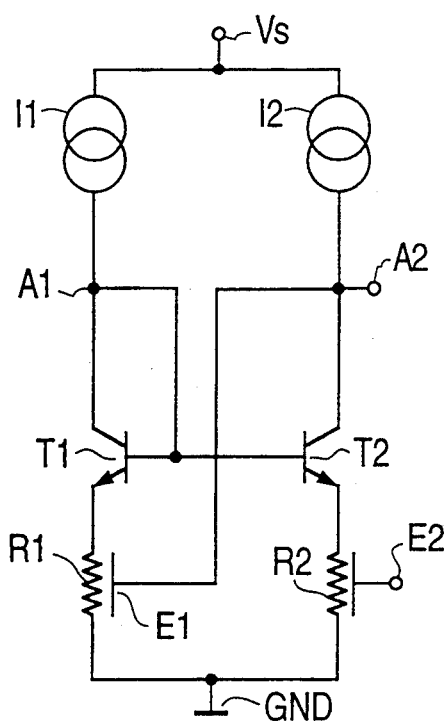
FIG. 8 shows an isolation amplifier as an embodiment example of the present invention.
Figure 9:
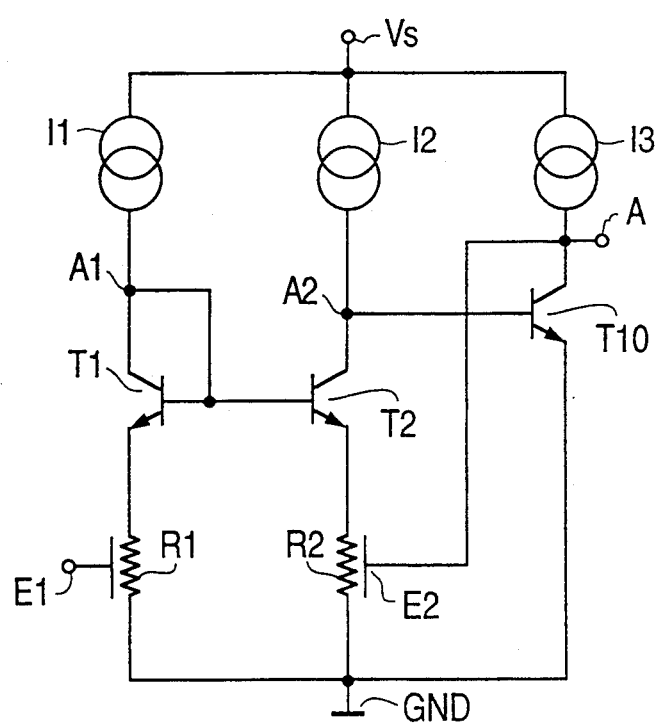
FIG. 9 shows a further development of the isolation amplifier shown in FIG. 8.

The function of an isolation amplifier can be obtained with the circuits according to FIGS. 8 and 9. In FIG. 8, the output A at the collector electrode of the transistor T2 is connected for this purpose to the input E1 in a basic circuit corresponding to FIG. 6. This acts as negative voltage feedback and results in the output A following the input E2. The gain factor is, however, slightly less than one because the loop gain is not very large. The circuit according to FIG. 9 eliminates this defect by looping in an additional npn amplifier transistor T10 with a current source I3 at its collector electrode. The base electrode of this transistor T10 is connected to the collector electrode A2 of the transistor T2 while its emitter electrode is connected to the reference point GND of the circuit. The collector electrode of this transistor T10 represents the output A of the circuit and is connected at the same time to the gate electrode E2. A higher current is yielded at the output A with this circuit. Because of the additional phase reversal in the transistor T10, the inputs E1 and E2 exchange their phase relationship and, consequently, the output A must be connected to the input E2 which is now inverted.

The circuits described in FIGS. 1 to 9 can also be constructed using transistors of the opposite conductivity type. The polarities must be adjusted accordingly and instead of p-type pinch resistors it is necessary to use n-type pinch resistors.

Finally the invention can also be used for differential amplifiers with more than two branches.

What is claimed is:

1. A circuit arrangement comprising:
    at least two bipolar transistors, each transistor having a base electrode, an emitter electrode and a collector electrode, the at least two transistors being connected together at their base electrodes and the base electrodes being connected to an auxiliary voltage, and the collector electrodes being respective first and second outputs of the circuit arrangement;
    an emitter resistor connected to the emitter electrode of each transistor, each emitter resistor being a pinch resistor having a gate electrode for controlling a resistance value of the respective emitter resistor, and the gate electrodes of the respective pinch resistors being first and second inputs of the circuit arrangement, each pinch resistor connecting the respective emitter electrode of the transistors to a reference potential; and
    series circuit for supplying the auxiliary voltage, the series circuit having a third transistor connected as a diode and a further pinch resistor, the series circuit having a supply current flowing through the series circuit.

2. A circuit arrangement comprising:
    at least two bipolar transistors, each transistor having a base electrode, an emitter electrode and a collector electrode, the at least two transistors being connected together at their base electrodes and the base electrodes being connected to an auxiliary voltage, and the collector electrodes being respective first and second outputs of the circuit arrangement with a current being supplied to the first output;
    an emitter resistor connected to the emitter electrode of each transistor, each emitter resistor being a pinch resistor having a gate electrode for controlling a resistance value of the respective emitter resistor, and the gate electrodes of the respective pinch resistors being first and second inputs of the circuit arrangement, each pinch resistor connecting the respective emitter electrode of the transistors to a reference potential; and
    an amplifier having an input and an output, the input of the amplifier being connected to the first output and the output of the amplifier being connected to the base electrodes of the transistors.

3. A circuit arrangement in accordance with claim 2, wherein the amplifier is a differential amplifier having an inverting input and a non-inverting input, the non-inverting input being connected to the first output and the inverting input being connected to the auxiliary voltage.

4. A circuit arrangement comprising:
    at least two bipolar transistors, each transistor having a base electrode, an emitter electrode and a collector electrode, the at least two transistors being connected together at their base electrodes and the base electrodes being connected to an auxiliary voltage, and the collector electrodes being respective first and second outputs of the circuit arrangement, the first output being connected to the base electrodes of the transistors;
    a current source for supplying current to the base electrodes of the transistors; and
    an emitter resistor connected to the emitter electrode of each transistor, each emitter resistor being a pinch resistor having a gate electrode for controlling a resistance value of the respective emitter resistor, and the gate electrodes of the respective pinch resistors being first and second inputs of the circuit arrangement, each pinch resistor connecting the respective emitter electrode of the transistors to a reference potential.

5. A circuit arrangement in accordance with claim 2, wherein the amplifier is a differential amplifier having a non-inverting input, the non-inverting input being connected to the first output.

6. A circuit arrangement in accordance with claim 2, wherein the amplifier is an emitter follower.

7. A circuit arrangement in accordance with claim 2, wherein the amplifier includes
    a third transistor in a common-emitter configuration, the third transistor having a collector electrode, and
    a current balancing circuit connected to the collector electrode of the third transistor, an output of the current balancing circuit forming the output of the amplifier.

8. A circuit arrangement in accordance with claim 6, wherein the second output of the circuit arrangement is connected to the first input of the circuit arrangement.

9. A circuit arrangement in accordance with claim 6, wherein a third transistor in a common-emitter configuration, the third transistor having a base and a collector, the base of the third transistor being connected to the collector electrode of one of the at least two transistors and the collector of the third transistor being connected to the second input of the circuit arrangement, the collector of the third transistor being an output of the circuit arrangement.

* * * * *